US010977405B2

(12) United States Patent
Bowes et al.

(10) Patent No.: US 10,977,405 B2
(45) Date of Patent: Apr. 13, 2021

(54) FILL PROCESS OPTIMIZATION USING FEATURE SCALE MODELING

(71) Applicant: Lam Research Corporation, Fremont, CA (US)

(72) Inventors: Michael Bowes, Scotts Valley, CA (US); Atashi Basu, Menlo Park, CA (US); Kapil Sawlani, San Jose, CA (US); Dongyao Li, San Jose, CA (US); Anand Chandrashekar, Fremont, CA (US); David M. Fried, South Salem, NY (US); Michal Danek, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/260,870

(22) Filed: Jan. 29, 2019

(65) Prior Publication Data
US 2020/0242209 A1    Jul. 30, 2020

(51) Int. Cl.
G06F 17/50 (2006.01)
G06F 30/39 (2020.01)
H01L 21/768 (2006.01)
G06F 30/33 (2020.01)

(52) U.S. Cl.
CPC .............. G06F 30/39 (2020.01); G06F 30/33 (2020.01); H01L 21/76883 (2013.01)

(58) Field of Classification Search
USPC .................................... 716/54, 50, 110, 137
See application file for complete search history.

(56) References Cited

U.S. PATENT DOCUMENTS

| 5,114,233 | A  | 5/1992  | Clark et al.  |
| 5,421,934 | A  | 6/1995  | Misaka et al. |
| 6,268,226 | B1 | 7/2001  | Angell et al. |
| 6,410,351 | B1 | 6/2002  | Bode et al.   |
| 6,650,423 | B1 | 11/2003 | Markle et al. |
| 6,684,382 | B2 | 1/2004  | Liu           |
| 6,753,115 | B2 | 6/2004  | Zhang et al.  |

(Continued)

FOREIGN PATENT DOCUMENTS

| CN | 1501178 A | 6/2004 |
| CN | 1739185 A | 2/2006 |

(Continued)

OTHER PUBLICATIONS

U.S. Office Action, dated Jan. 25, 2018, issued in U.S. Appl. No. 14/972,969.

(Continued)

*Primary Examiner* — Brian Ngo
(74) *Attorney, Agent, or Firm* — Weaver Austin Villeneuve & Sampson LLP

(57) ABSTRACT

Provided herein are systems and methods for optimizing feature fill processes. The feature fill optimization systems and methods may be used to optimize feature fill from a small number of patterned wafer tests. The systems and methods may be used for optimizing enhanced feature fill processes including those that include inhibition and/or etch operations along with deposition operations. Results from experiments may be used to calibrate a feature scale behavioral model. Once calibrated, parameter space may be iteratively explored to optimize the process.

20 Claims, 11 Drawing Sheets

(56) References Cited

U.S. PATENT DOCUMENTS

| | | | |
|---|---|---|---|
| 6,804,572 B1 | 10/2004 | Cooperberg et al. | |
| 6,903,826 B2 | 6/2005 | Usui et al. | |
| 7,139,632 B2 | 11/2006 | Cooperberg et al. | |
| 7,402,257 B1 | 7/2008 | Sonderman et al. | |
| 7,504,182 B2 | 3/2009 | Stewart et al. | |
| 7,588,946 B2 | 9/2009 | Tso et al. | |
| 7,600,212 B2 | 10/2009 | Zach et al. | |
| 7,739,651 B2 | 6/2010 | Melvin, III et al. | |
| 7,812,966 B2 | 10/2010 | Hoffmann et al. | |
| 7,849,423 B1 | 12/2010 | Yenikaya et al. | |
| 7,962,867 B2 | 6/2011 | White et al. | |
| 8,001,512 B1* | 8/2011 | White | G06F 30/39 |
| | | | 716/119 |
| 8,279,409 B1 | 10/2012 | Sezginer et al. | |
| 8,832,610 B2 | 9/2014 | Ye et al. | |
| 9,015,016 B2 | 4/2015 | Lorenz et al. | |
| 9,471,746 B2 | 10/2016 | Rieger et al. | |
| 9,547,740 B2 | 1/2017 | Moroz et al. | |
| 9,659,126 B2 | 5/2017 | Greiner et al. | |
| 9,792,393 B2 | 10/2017 | Tetiker et al. | |
| 9,996,647 B2 | 6/2018 | Tetiker et al. | |
| 10,032,681 B2 | 7/2018 | Bailey, III et al. | |
| 10,197,908 B2 | 2/2019 | Sriraman et al. | |
| 10,303,830 B2 | 5/2019 | Tetiker et al. | |
| 10,386,828 B2 | 8/2019 | Tetiker et al. | |
| 10,534,257 B2 | 1/2020 | Tetiker et al. | |
| 10,572,697 B2 | 2/2020 | Feng et al. | |
| 10,585,347 B2 | 3/2020 | Sriraman et al. | |
| 2003/0008507 A1 | 1/2003 | Bell et al. | |
| 2003/0113766 A1 | 6/2003 | Pepper et al. | |
| 2004/0019872 A1 | 1/2004 | Lippincott et al. | |
| 2005/0074907 A1 | 4/2005 | Kriz et al. | |
| 2005/0192914 A1 | 9/2005 | Drege et al. | |
| 2006/0064280 A1 | 3/2006 | Vi Vuong et al. | |
| 2006/0141484 A1 | 6/2006 | Rucker et al. | |
| 2007/0031745 A1 | 2/2007 | Ye et al. | |
| 2007/0050749 A1 | 3/2007 | Ye et al. | |
| 2007/0061772 A1 | 3/2007 | Ye et al. | |
| 2007/0249071 A1 | 10/2007 | Lian et al. | |
| 2007/0281478 A1 | 12/2007 | Ikegami et al. | |
| 2008/0007739 A1 | 1/2008 | Vi Vuong et al. | |
| 2008/0035608 A1 | 2/2008 | Thomas et al. | |
| 2008/0243730 A1 | 10/2008 | Bischoff et al. | |
| 2009/0048813 A1 | 2/2009 | Ichikawa et al. | |
| 2009/0087143 A1 | 4/2009 | Jeon et al. | |
| 2009/0253222 A1 | 10/2009 | Morisawa et al. | |
| 2011/0022215 A1 | 1/2011 | Keil et al. | |
| 2011/0159690 A1* | 6/2011 | Chandrashekar | ............... |
| | | | H01L 21/32136 |
| | | | 438/675 |
| 2011/0292375 A1 | 12/2011 | Marx et al. | |
| 2012/0002912 A1 | 1/2012 | Studenkov et al. | |
| 2012/0009785 A1* | 1/2012 | Chandrashekar | C23C 16/045 |
| | | | 438/669 |
| 2012/0022836 A1 | 1/2012 | Ferns et al. | |
| 2012/0228125 A1* | 9/2012 | Wu | H01J 37/3405 |
| | | | 204/192.15 |
| 2013/0171822 A1* | 7/2013 | Chandrashekar | ............... |
| | | | H01L 21/28556 |
| | | | 438/675 |
| 2014/0032463 A1 | 1/2014 | Jin et al. | |
| 2015/0056803 A1* | 2/2015 | Chandrashekar | ............... |
| | | | H01L 21/76874 |
| | | | 438/666 |
| 2015/0079500 A1 | 3/2015 | Shih et al. | |
| 2015/0142395 A1 | 5/2015 | Cao et al. | |
| 2015/0154145 A1 | 6/2015 | Watanabe et al. | |
| 2015/0366523 A1* | 12/2015 | Ben-Haim | A61K 51/0406 |
| | | | 600/431 |
| 2015/0371134 A1 | 12/2015 | Chien et al. | |
| 2016/0091769 A1 | 3/2016 | Rozbicki et al. | |
| 2016/0284077 A1 | 9/2016 | Brill | |
| 2016/0313651 A1 | 10/2016 | Middlebrooks et al. | |
| 2016/0322267 A1 | 11/2016 | Kim et al. | |
| 2017/0039308 A1* | 2/2017 | Moroz | G06F 30/367 |
| 2017/0115556 A1 | 4/2017 | Shim et al. | |
| 2017/0147724 A1 | 5/2017 | Regli et al. | |
| 2017/0176983 A1 | 6/2017 | Tetiker et al. | |
| 2017/0228482 A1* | 8/2017 | Tetiker | G01N 21/55 |
| 2017/0256463 A1 | 9/2017 | Bailey, III et al. | |
| 2017/0351952 A1 | 12/2017 | Zhang et al. | |
| 2017/0363950 A1 | 12/2017 | Sriraman et al. | |
| 2017/0365513 A1* | 12/2017 | Yang | C23C 16/04 |
| 2017/0371991 A1 | 12/2017 | Tetiker et al. | |
| 2018/0157161 A1 | 6/2018 | Mailfert et al. | |
| 2018/0182632 A1 | 6/2018 | Ye et al. | |
| 2018/0239851 A1 | 8/2018 | Ypma et al. | |
| 2018/0260509 A1 | 9/2018 | Tetiker et al. | |
| 2018/0314148 A1 | 11/2018 | Tetiker et al. | |
| 2019/0049937 A1 | 2/2019 | Tetiker et al. | |
| 2019/0250501 A1 | 8/2019 | Sriraman et al. | |
| 2019/0311083 A1 | 10/2019 | Feng et al. | |

FOREIGN PATENT DOCUMENTS

| | | |
|---|---|---|
| CN | 1868043 A | 11/2006 |
| CN | 1940715 A | 4/2007 |
| CN | 101151719 A | 3/2008 |
| CN | 101313308 A | 11/2008 |
| CN | 101976045 A | 2/2011 |
| CN | 104103510 A | 10/2014 |
| CN | 104518753 A | 4/2015 |
| CN | 104736744 A | 6/2015 |
| JP | 2017-227892 A | 12/2017 |
| KR | 20170017789 A | 2/2017 |
| WO | WO 2006/104655 A2 | 10/2006 |
| WO | WO 2018/204193 | 11/2018 |

OTHER PUBLICATIONS

U.S. Final Office Action, dated Aug. 27, 2018, issued in U.S. Appl. No. 14/972,969.

U.S. Office Action, dated Jan. 10, 2019, issued in U.S. Appl. No. 14/972,969.

U.S. Office Action, dated Mar. 22, 2017, issued in U.S. Appl. No. 15/018,708.

U.S. Notice of Allowance, dated Jun. 7, 2017, issued in U.S. Appl. No. 15/018,708.

U.S. Notice of Allowance, dated Feb. 6, 2018 issued in U.S. Appl. No. 15/698,458.

U.S. Office Action, dated Oct. 2, 2017, issued in U.S. Appl. No. 15/698,458.

Office Action dated Jun. 14, 2018 issued in U.S. Appl. No. 15/972,063.

Final Office Action dated Nov. 7, 2018 issued in U.S. Appl. No. 15/972,063.

U.S. Office Action, dated Aug. 10, 2017, issued in U.S. Appl. No. 15/059,073.

Notice of Allowance dated Jan. 11, 2018 issued in U.S. Appl. No. 15/059,073.

U.S. Office Action, dated Dec. 7, 2017, issued in U.S. Appl. No. 15/188,910.

U.S. Final Office Action, dated May 23, 2018 issued in U.S. Appl. No. 15/188,910.

U.S. Notice of Allowance, dated Sep. 27, 2018 issued in U.S. Appl. No. 15/188,910.

U.S. Office Action, dated Jul. 11, 2018 issued in U.S. Appl. No. 15/367,060.

U.S. Notice of Allowance, dated Nov. 26, 2018 issued in U.S. Appl. No. 15/367,060.

International Search Report and Written Opinion dated Aug. 10, 2018 issued in Application No. PCT/US2018/029874.

Cooperberg, D.J., et al. (Sep./Oct. 2002) "Semiempirical profile simulation of aluminum etching in a $Cl_2$ / $BCl_3$ plasma," *Journal of Vacuum Science & Technology A.*, 20(5):1536-1556 [doi: http://dx.doi.org/10.1116/1.1494818].

Goodlin et al. (May 2002) "Quantitative Analysis and Comparison of Endpoint Detection Based on Multiple Wavelength Analysis,"

(56) References Cited

OTHER PUBLICATIONS

*201st Meeting of the Electrochemical Society, International Symposium on Plasma Processing XIV*, Abs. 415, Philadelphia, PA, 30 pages.

Hoekstra, R. et al. (Jul./Aug. 1997) "Integrated plasma equipment model for polysilicon etch profiles in an inductively coupled plasma reactor with subwafer and superwafer topography," *Journal of Vacuum Science & Technology A*, 15(4):1913-1921 [doi: http://dx.doi.org/10.1116/1.580659].

Hoekstra, R. et al. (Jul./Aug. 1998) "Microtrenching resulting from specular reflection during chlorine etching of silicon," *Journal of Vacuum Science & Technology B, Nanotechnology and Microelectronics*, 16(4):2102-2104 [doi: http://dx.doi.org/10.1116/1.590135].

Hoekstra, R. et al. (Nov. 1, 1998) "Comparison of two-dimensional and three-dimensional models for profile simulation of poly-Si etching of finite length trenches," *Journal of Vacuum Science & Technology A*, 16(6):3274-3280 [doi:http://dx.doi.org/10.1116/1.581533].

Huard, C.M., et al. (Jan. 17, 2017) "Role of neutral transport in aspect ratio dependent plasma etching of three-dimensional features," *Journal of Vacuum Science & Technology A.*, 35(5):05C301-1-05C301-18. [doi: http://dx.doi.org/10.1116/1.4973953].

Kushner, M.J., (Sep. 18, 2009) "Hybrid modelling of low temperature plasmas for fundamental investigations and equipment design," *Journal of Physics D.*, 42(1904013):1-20 [doi: 10.1088/0022-3727/42/19/194013].

Lynn et al. (2009) "Virtual Metrology for Plasma Etch using Tool Variables," *IEEE*, pp. 143-148.

Lynn, Shane (Apr. 2011) "Virtual Metrology for Plasma Etch Processes," *A thesis submitted in partial fulfillment for the degree of Doctor of Philosophy in the Faculty of Science and Engineering, Electronic Engineering Department*, National University of Ireland, Maynooth, 361 pages.

Moharam et al. (Jul. 1981) "Rigorous coupled-wave analysis of planar-grating diffraction," *J. Opt. Soc. Am.*, 71(7):811-818.

Radjenović et al. (2007) "3D Etching profile evolution simulations: Time dependence analysis of the profile charging during SiO2 etching in plasma," *5th EU-Japan Joint Symposium on Plasma Process, Journal of Physics: Conference Series*, 86:13 pages.

Ringwood et al. (Feb. 2010) "Estimation and Control in Semiconductor Etch: Practice and Possibilities," *IEEE Transactions on Semiconductor Manufacturing*, 23(1):87-98.

Sankaran, A. et al. (Jan. 15, 2005) "Etching of porous and solid $SiO_2$ in $Ar/c-C_4F_8$, $O_2/c-C_4F_8$ and $Ar/O_2/c-C_4F_8$ plasmas," *Journal of Applied Physics*, 97(2):023307-1-023307-10. [doi: http://dx.doi.org/10.1063/1.1834979] [retrieved on Jan. 29, 2005].

Sankaran, A. et al. (Jul./Aug. 2004) "Integrated feature scale modeling of plasma processing of porous and solid $SiO_2$. I. Fluorocarbon etching," *Journal of Vacuum Science & Technology A.*, 22(4):1242-1259 [doi: http://dx.doi.org/10.1116/1.1764821].

Yue et al. (Jan./Feb. 2001) "Plasma etching endpoint detection using multiple wavelengths for small open-area wafers," *J. Vac. Sci. Technol. A*, 19(1):66-75.

Zeng (2012) "Statistical Methods for Enhanced Metrology in Semiconductor/Photovoltaic Manufacturing," A dissertation submitted in partial satisfaction of the requirements for the degree of Doctor of Philosophy in Engineering—Electrical Engineering and Computer Sciences in the Graduate Division of the University of California, Berkeley, 171 pages.

Zhang, D. et al. (Mar./Apr. 2001) "Investigations of surface reactions during $C_2F6$ plasma etching of $SiO_2$ with equipment and feature scale models," *Journal of Vacuum Science & Technology A*, 19(2):524-538 [doi: http://dx.doi.org/10.1116/1.1349728].

Zhang, Y., (Sep. 30, 2015) Doctoral Dissertation of "Low Temperature Plasma Etching Control through Ion Energy Angular Distribution and 3-Dimensional Profile Simulation," *Dept. of Electrical Engineering at the University of Michigan*, pp. 49-71, Appendix B. pp. 243-248 [doi: http://hdl.handle.net/2027.42/113432].

U.S. Appl. No. 15/673,321, filed Aug. 9, 2017, Tetiker et al.
U.S. Appl. No. 15/946,940, filed Apr. 6, 2018, Feng et al.
U.S. Appl. No. 16/224,651, filed Dec. 18, 2018, Sriraman et al.
U.S. Notice of Allowance, dated Apr. 5, 2019, issued in U.S. Appl. No. 14/972,969.
U.S. Office Action, dated Jul. 10, 2019 issued in U.S. Appl. No. 16/224,651.
U.S. Notice of Allowance, dated Oct. 30, 2019 issued in U.S. Appl. No. 16/224,651.
U.S. Notice of Allowance, dated Jul. 23, 2019 issued in U.S. Appl. No. 15/583,610.
U.S. Office Action dated Jul. 10, 2019 issued in U.S. Appl. No. 15/946,940.
U.S. Notice of Allowance dated Oct. 16, 2019 issued in U.S. Appl. No. 15/946,940.
U.S. Office Action, dated Mar. 4, 2019 issued in U.S. Appl. No. 15/673,321.
Chinese First Office Action dated Dec. 2, 2019 issued in Application No. CN 201611166040.9.
Chinese First Office Action dated Mar. 11, 2020 issued in Application No. CN 201710475240.0.
Chinese First Office Action dated Mar. 6, 2020 issued in Application No. CN 201710068974.7.
International Preliminary Report on Patentability dated Nov. 14, 2019 issued in Application No. PCT/US2018/029874.
Chinese First Office Action dated Feb. 25, 2019 issued in Application No. CN 201710121052.8.
International Search Report and Written Opinion dated Jul. 31, 2019 issued in Application No. PCT/US2019/026851.
International Search Report and Written Opinion dated Jul. 5, 2019 issued in Application No. PCT/US2019/025668.
International Search Report and Written Opinion dated Jun. 5, 2020 issued in Application No. PCT/US2020/015464.
"SEMulator3D," Product Brochure, Coventor, A Lam Research Company, 3 pp. (known as of Mar. 2, 2018) <URL:https://www.coventor.com/semiconductor-solutions/semulator3d/>.
"SEMulator3D Advanced Modeling," Web page, Coventor, A Lam Research Company, 5 pp. <URL: https://www.coventor.com/semiconductor-solutions/semulator3d/semulator3d-advanced-modeling/> (known as of Mar. 2, 2018).
"SEMulator3D," Web page, Coventor, A Lam Research Company, 5 pp. <URL:https://www.coventor.com/semiconductor-solutions/semulator3d/> (known as of Mar. 2, 2018).
U.S. Appl. No. 16/741,735, filed Jan. 13, 2020, Feng et al.

* cited by examiner

FILL PROCESS OPTIMIZATION USING FEATURE SCALE MODELING

BACKGROUND

The performance of semiconductor device fabrication operations such as feature fill processes is often essential to the success of a semiconductor device processing workflow. Advanced fill processes including inhibition operations may be used to fill device features with aggressive geometries or compensate for lack of conformality in the deposition step itself. For example, a deposition-inhibition-deposition (DID) process may involve a first deposition followed by an inhibition process to inhibit deposition at the feature opening and a subsequent deposition to fill the feature. However, optimization of a DID process can be tremendously expensive and time consuming, involving multiple design of experiment (DOE) iterations and costly imaging for each sample.

The background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

Disclosed herein are systems and methods for optimizing feature fill processes. The systems and methods may be used to optimize feature fill from a small number of patterned wafer tests. The systems and methods may be used for optimizing enhanced feature fill processes including those that include inhibition and/or etch operations along with deposition operations. Results from patterned wafer tests may be used to calibrate a feature scale behavioral model. Once calibrated, parameter space may be iteratively explored to optimize the process.

One aspect of the disclosure may be implemented in a feature fill optimization computational system that includes one or more processors; program instructions for executing on the one or more processors, the program instructions including instructions for: obtaining metrology results from one or more feature fill operations performed on a set of sample features; using the metrology results to calibrate a behavioral model of at least one of the one or more feature fill operations; and iteratively applying the calibrated model while varying one or more behavioral parameters to optimize the behavioral parameters.

In some embodiments, the instructions further include instructions for, from the optimized behavioral parameters, designing a feature fill process to be performed on a semiconductor substrate. In some embodiments, the one or more feature fill operations include an inhibition operation and the behavioral model includes an inhibition model. In some such embodiments, the one or more feature fill operations include a first deposition operation prior to the inhibition operation and a second deposition operation after the inhibition operation. In some such embodiments, the behavioral model includes one or more deposition models. In the same or other embodiments, the one or more feature fill operations include an etch operation and the behavioral model includes an etch model. In some such embodiments, the one or more feature fill operations include a first deposition operation prior to the etch operation and a second deposition operation after the etch operation. In some embodiments, the one or more feature fill operations include multiple etch operations and the behavioral model includes one or more etch models. In some embodiments, the one or more feature fill operations include multiple inhibition operations and the behavioral model includes one or more inhibition models. In some embodiments, the behavioral model includes one or more deposition models.

In some embodiments, the metrology results comprise image analysis results. In some embodiments, the set of sample features has no more than ten sample features. In some embodiments, the instructions further comprise instructions to optimize the behavioral parameters based on one or more of electrical resistance, void area, and void location.

Another aspect of the disclosure may be implemented in a computer-implemented method that includes obtaining metrology results from one or more feature fill operations performed on a set of sample features; using the metrology results to calibrate a behavioral model of at least one of the one or more feature fill operations; and iteratively applying the calibrated model while varying one or more behavioral parameters to optimize the behavioral parameters.

In some embodiments, the method further includes, from the optimized behavioral parameters, designing a feature fill process to be performed on a semiconductor substrate. In some such embodiments, the method further includes performing the feature fill process.

In some embodiments, the one or more feature fill operations include an inhibition operation and the behavioral model includes an inhibition model. In some such embodiments, the one or more feature fill operations include a first deposition operation prior to the inhibition operation and a second deposition operation after the inhibition operation. In some such embodiments, the behavioral model includes one or more deposition models.

In the same or other embodiments, the one or more feature fill operations include an etch operation and the behavioral model includes an etch model. In some such embodiments, the one or more feature fill operations include a first deposition operation prior to the etch operation and a second deposition operation after the etch operation.

In some embodiments, the one or more feature fill operations include multiple etch operations and the behavioral model includes one or more etch models. In some embodiments, the one or more feature fill operations include multiple inhibition operations and the behavioral model includes one or more inhibition models. In some embodiments, the behavioral model includes one or more deposition models.

In some embodiments, the metrology results comprise image analysis results. In some embodiments, the set of sample features has no more than ten sample features. In some embodiments, the method further includes optimizing the behavioral parameters based on one or more of electrical resistance, void area, and void location.

Another aspect of the disclosure may be implemented in the computer program product including a non-transitory computer readable medium on which is provided computer executable instructions for obtaining metrology results from one or more feature fill operations performed on a set of sample features; using the metrology results to calibrate a behavioral model of at least one of the one or more feature fill operations; and iteratively applying the calibrated model while varying one or more behavioral parameters to optimize the behavioral parameters.

These and other aspects of the disclosure are discussed further below with reference to the drawings.

DETAILED DESCRIPTION

Provided herein are systems and methods for optimizing feature fill processes. The feature fill optimization systems and methods may be used to optimize feature fill from a small number of patterned wafer tests. The systems and methods may be used for optimizing enhanced feature fill processes including those that include inhibition and/or etch operations along with deposition operations.

Figure 1:
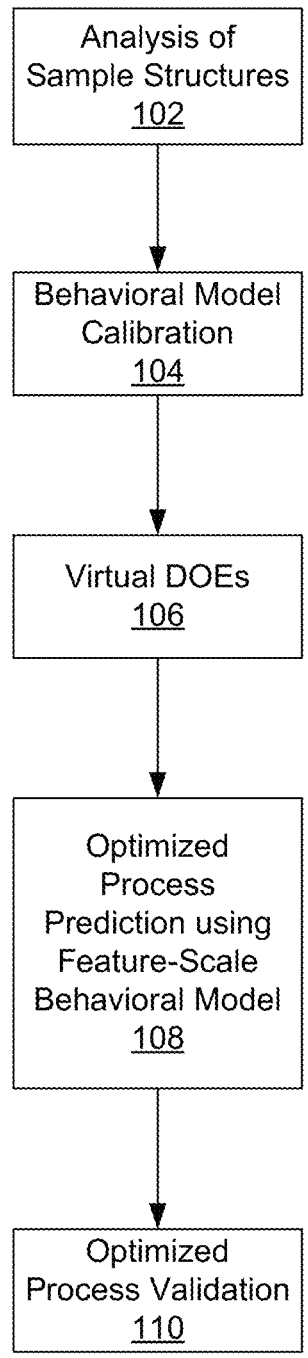
FIG. 1 is a flow diagram depicting various operations in a high level method for optimizing a feature fill process.

FIG. 1 is a flow diagram illustrating operations in a high level method of optimizing a feature fill process. The method begins at an operation 102 in which analysis of sample structures is performed. In some embodiments, image analysis may be performed. The sample structures may be imaged prior to and after a fill process is performed as well as at various stages during the fill process. The sample structures include features for which the fill is to be optimized during a semiconductor fabrication process. Examples of features include via, trenches, and contact holes formed in one or more layers of dielectric, conducting, or semi-conducting material. In some embodiments, the structure is a 3D NAND structure. For example, a substrate may include a wordline structure having at least 60 lines with trenches at least 200 Å deep.

In some embodiments, the features are characterized by one or more of a narrow width, a re-entrant profile, constrictions within the feature, and high aspect ratios. A re-entrant profile is a profile that narrows from a bottom, closed end, or interior of the feature to the feature opening. According to various implementations, the profile may narrow gradually and/or include an overhang at the feature opening. An example of a feature having a re-entrant profile is shown in FIG. 3, described below.

The analysis may be performed on any appropriate images including scanning electron microscope (SEM) or transmission electron microscopy (TEM) images. In some implementations, the analysis includes extracting the profile of the film via computer vision and image processing algorithms. Any appropriate image processing algorithms may be employed including analysis based on image thresholding (with or without pre-processing such as filtering and anisotropic nonlinear diffusion algorithms) and/or unsupervised image segmentation (e.g., k-means or Gaussian Mixture Models) and/or neural networks (e.g., a fully convolutional network (FCN) for image segmentation such as U-Net). The method may alternatively be implemented with manual image analysis techniques. From the image analysis, metrology data such as feature profile, critical dimensions, depth, sidewall angles, etc. may be determined for the imaged features.

While image analysis is chiefly described below, block 102 may involve any appropriate metrological technique including SEM, TEM, scanning transmission electron microscopy (STEM), reflection electron microscopy (REM), atomic force microscopy (AFM), optical metrology, reflectometry, dome scatterometry, angle-resolved scatterometry, small-angle X-ray scatterometry and/or ellipsometry.

The analysis may be then be used to calibrate the behavior model of the process in an operation 104. In some implementations, behavioral models employ abstractions of processes to predict structural details of features produced by one or more semiconductor device fabrication operations. Examples of behavioral models are presented in U.S. Pat. Nos. 9,015,016 and 9,659,126, incorporated by reference herein. In the feature fill processes described herein, the behavior model referred in FIG. 1 may include multiple behavior models each of which models a different process stage. For example, as discussed below with reference to FIG. 4, a deposition-inhibition-deposition (DID) process may include a deposition 1 (Dep1) model, an inhibition model, and a deposition 2 (Dep2) model. Each behavior model may be independently calibrated using the image analysis from the appropriate process stage.

Due to the complex physics of fabrication processes, modeling behavior using a first-principles approach is difficult and computationally expensive. A feature scale behavioral model as described herein may be derived from knowledge of the process and analysis of the process recipe. The behavioral model employs a limited set of behavioral parameters that are correlated to or proportional to physical parameters such as sticking coefficient, diffusion coefficient, reaction rate, and the like. The behavioral model may be time and/or depth dependent. Calibrating the behavioral model can involve using statistical or genetic algorithms, or machine learning models to fit the behavioral parameters to metrology data.

Once the behavior model is calibrated, many virtual DOEs are performed to explore the parameter space of the model in an operation 106. For example, the behavioral parameters may be systematically varied to explore the impact of corresponding process changes without running wafers in the lab. The optimal fill conditions for the target feature may be predicted in an operation 108. These can then be validated in an operation 110 in which an actual feature on a substrate is filled.

Figure 2:
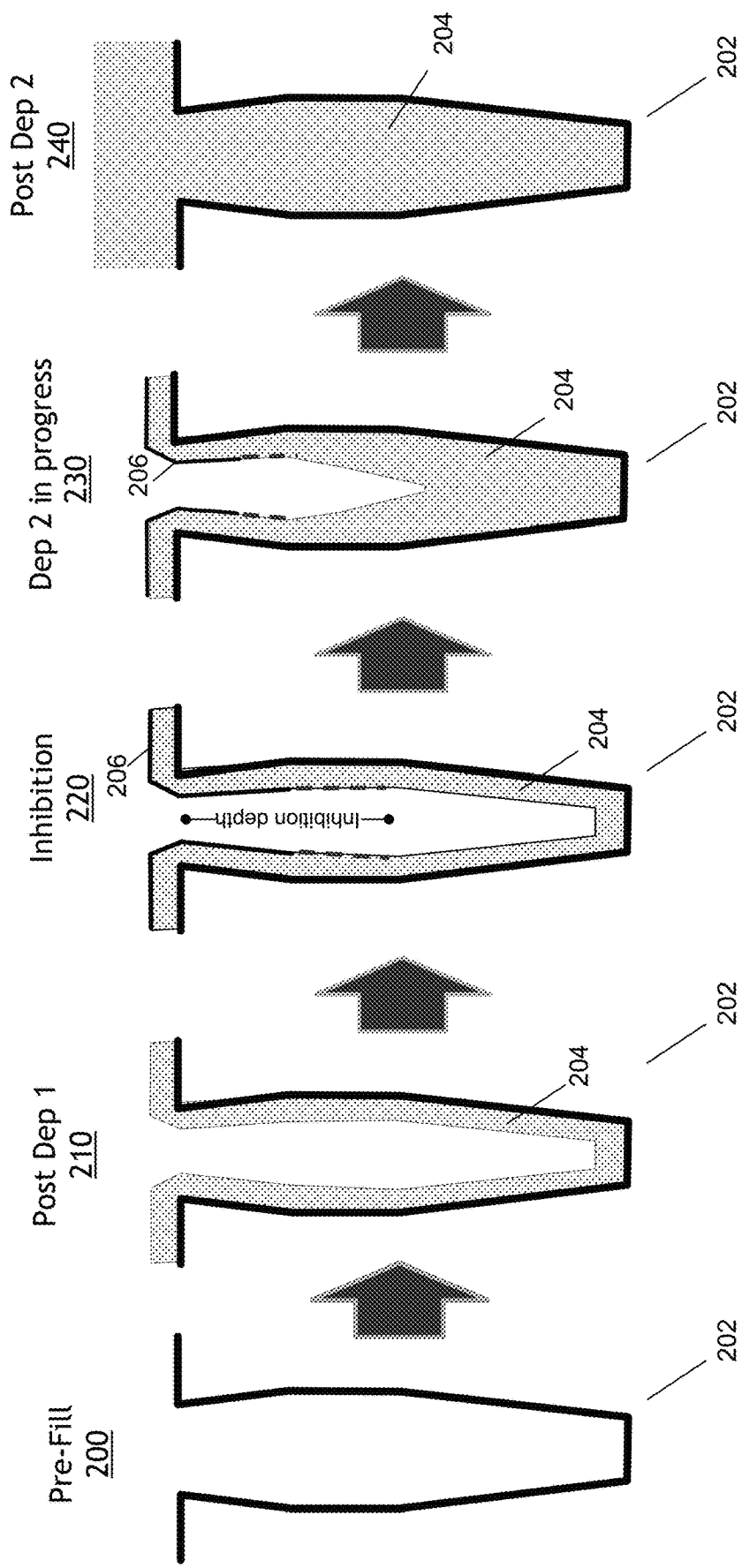
FIG. 2 illustrates a deposition-inhibition-deposition (DID) process for feature fill.

FIG. 2 shows an example of a DID deposition process that may be optimized using behavior models as described herein. First, at 200, an unfilled feature 202 is shown at a pre-fill stage. As described above, the feature 202 may be formed in one or more layers on a semiconductor substrate and may optionally have one or more layers that line the sidewalls and/or bottom of the feature. At 210, the feature 202 is shown after an initial deposition of the fill material to form a layer of the material 204 to be filled in the feature 202. Examples of material include tungsten, cobalt, molybdenum, and ruthenium though the techniques described herein may be used to optimize fill of any appropriate material including other conductors and dielectrics such as oxides (e.g., $SiO_x$, $Al_2O_3$), nitrides (e.g., SiN, TiN) and carbides (e.g., SiC). At 220, the feature 202 is shown after an inhibition treatment. The inhibition treatment is a treatment that has the effect of inhibiting subsequent deposition on the treated surfaces 206.

The inhibition may involve various mechanisms depending on various factors including the surfaces to be treated, the inhibition chemistry, and whether the inhibition is a thermal or plasma process. In one example, tungsten nucleation, and thus tungsten deposition, is inhibited by exposure to a nitrogen-containing chemistry. This can involve generation of activated nitrogen-containing species by a remote or direct plasma generator, for example, or exposure to ammonia vapor in an example of a thermal (non-plasma) process.

Examples of inhibition mechanisms can include a chemical reaction between activated species and the feature surface to form a thin layer of a compound material such as tungsten nitride (WN) or tungsten carbide (WC). In some embodiments, inhibition can involve a surface effect such as adsorption that passivates the surface without forming a layer of a compound material. It should be noted that the methods described herein do not rely on a detailed or complete understanding of the physical mechanisms that cause the inhibition behavior.

The inhibition may be characterized by an inhibition depth and an inhibition gradient. That is, the inhibition may vary with depth, such that the inhibition is greater at the feature opening than at the bottom of the feature, and may extend only partway into the feature. In the depicted example, the inhibition depth is about half of the full feature depth. In addition the inhibition treatment is stronger at the top of the feature, as graphically shown by the dotted line deeper within the feature.

Because deposition is inhibited near the feature opening, during the Dep2 stage shown at 230, the material preferentially deposits at the feature bottom while not depositing or depositing to a less extent at the feature opening. As discussed below with reference to FIGS. 3A and 3B, this can prevent the formation of voids and seams within the filled feature. As such, during Dep2, the material 204 may be filled in a manner characterized as bottom-up fill rather than the conformal Dep1 fill. As the deposition continues, the inhibition effect may be removed, such that deposition on the lightly treated surfaces may no longer be inhibited. This is illustrated at 230, with the treated surfaces 206 being less extensive than prior to the Dep2 stage. In the example of FIG. 2, as the Dep2 proceeds, the inhibition is eventually overcome on all surfaces and the feature is completely filled with the material 204 as shown at 240.

Figure 3A:
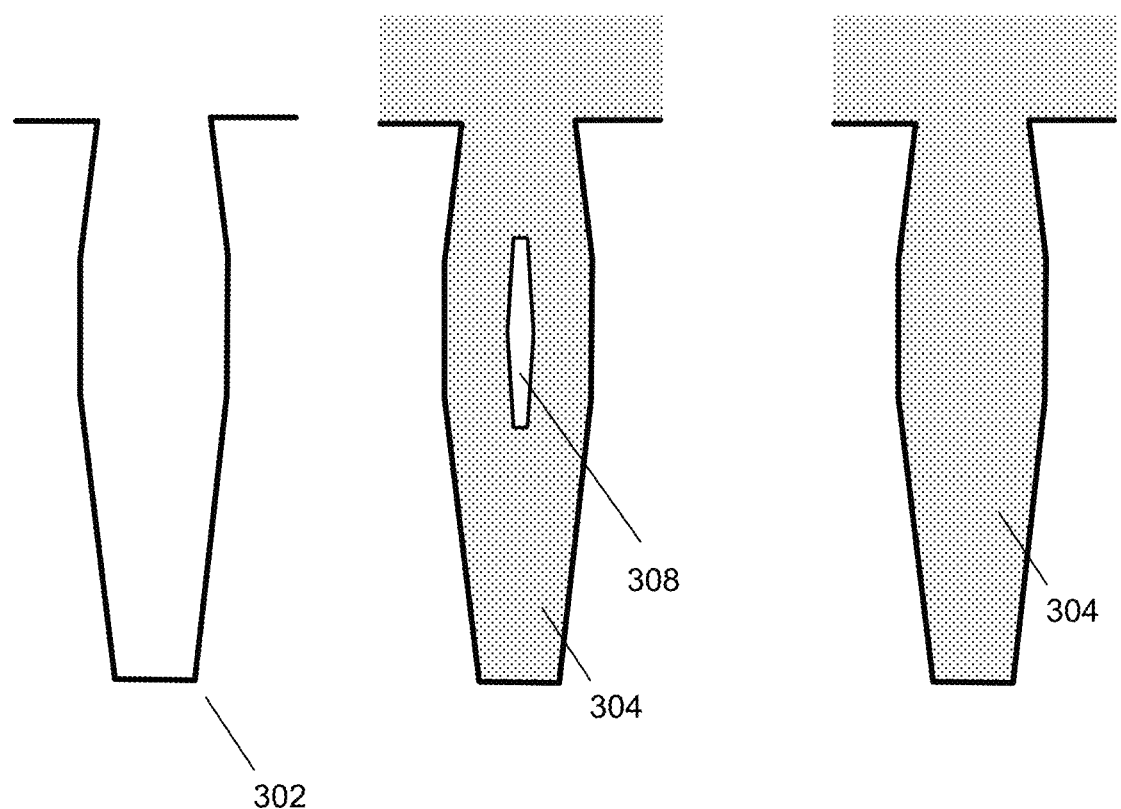
FIGS. 3A and 3B illustrate examples of feature fill with and without void formation.
Figure 3B:
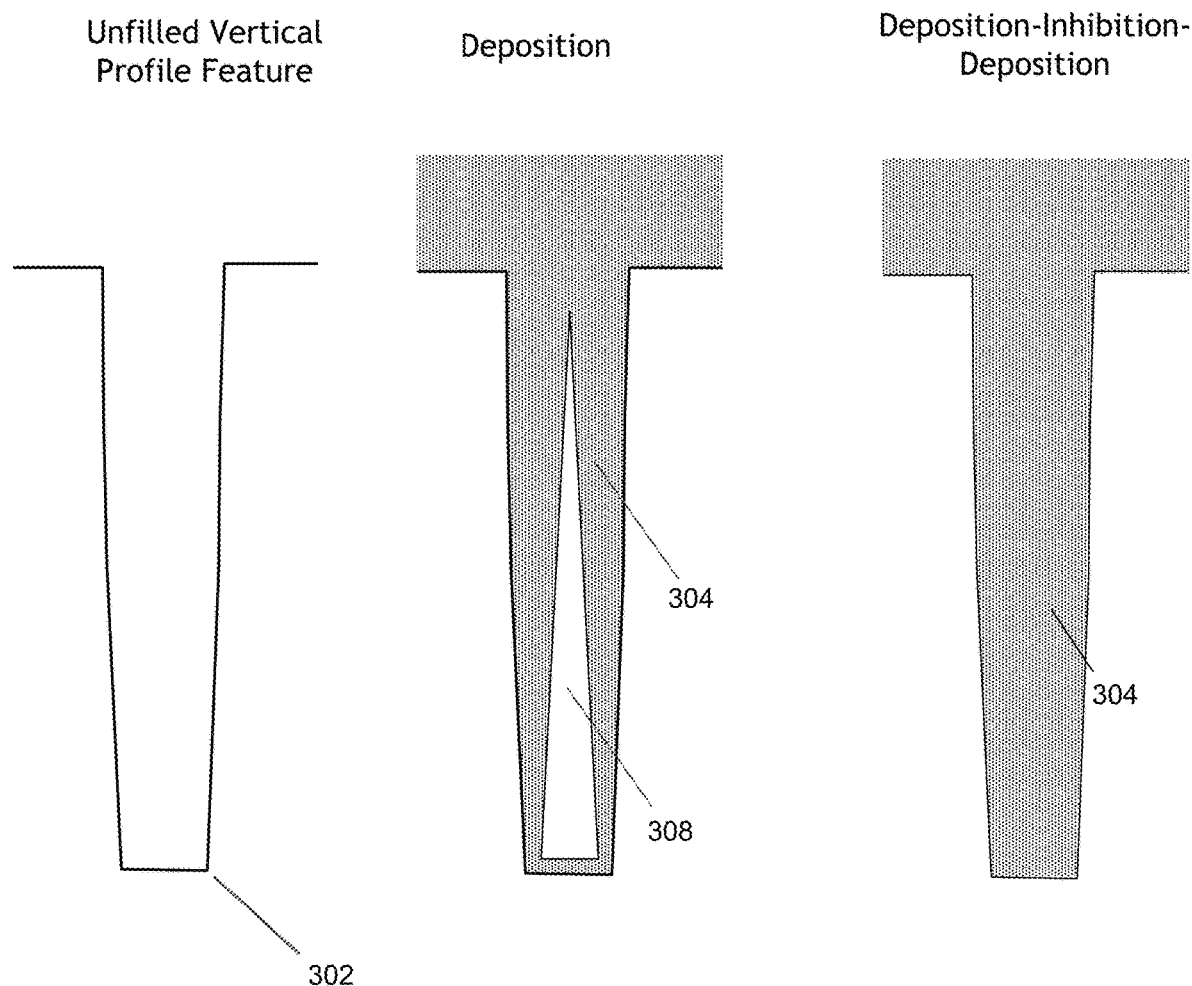

Performing an inhibition operation prior to at least one deposition operation can enable feature fill without forming a void. FIG. 3A provides an example of a feature 302, which is an unfilled re-entrant feature. Because of its re-entrancy, deposition of material 304 in the feature may lead to pinching off of the feature before the interior is completely filled. That is, the narrower opening may fill, blocking access to the feature interior. The result is a void 308. Voids are undesirable, and can lead to an increase in resistance and the possibility of coring during chemical-mechanical planarization. Using a DID process can result in void free fill as depicted in FIG. 3A. Similarly, in FIG. 3B, a periphery contact feature 303 with a vertical profile is shown. The periphery contact feature 303 is not re-entrant, however, deposition of a material 304 such as low stress tungsten in it is often non-conformal, leading to a void 308. Using a DID process can result in the void free fill.

Figure 4:
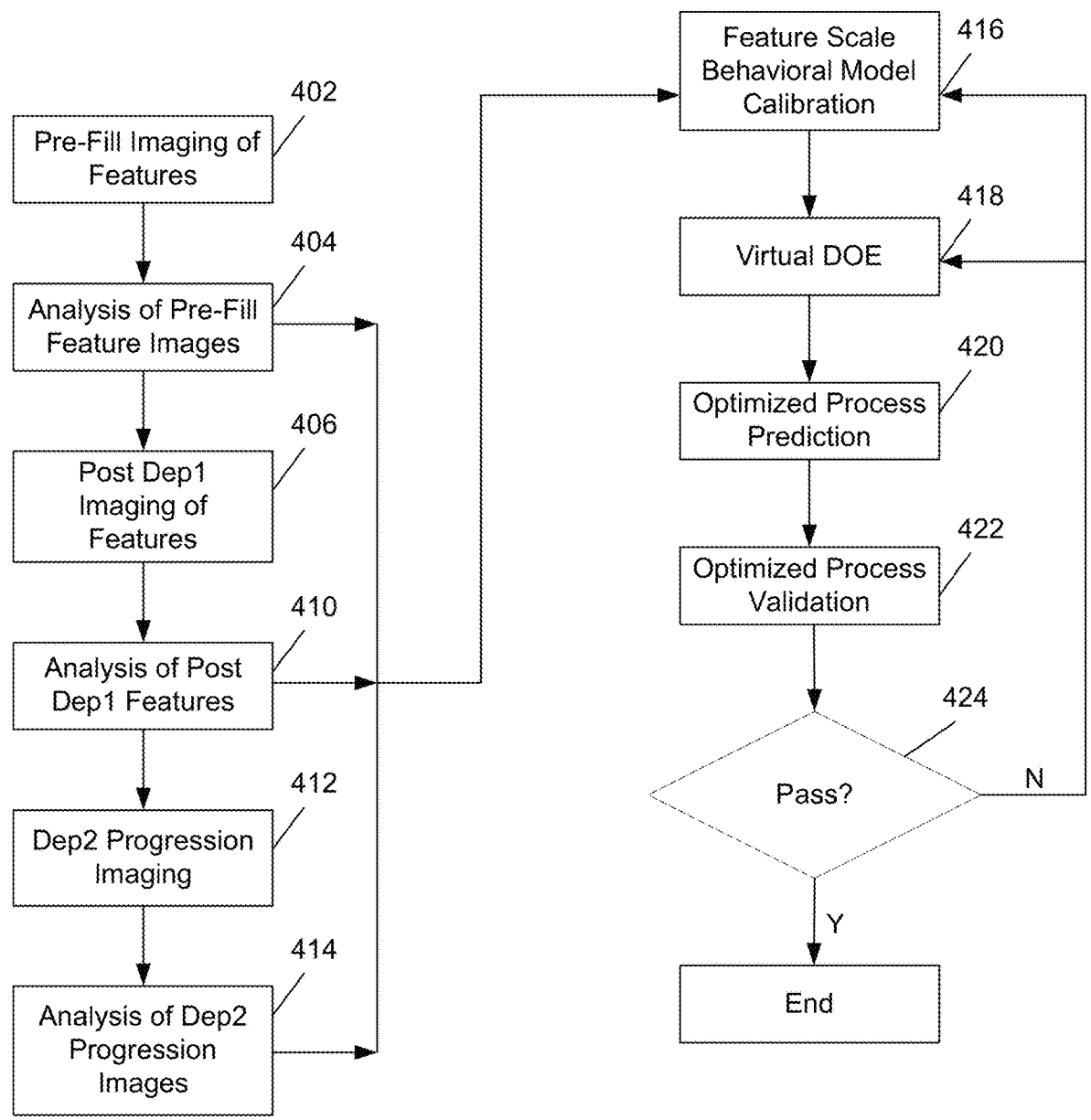
FIG. 4 is a flow diagram depicting various operations for optimizing a DID feature fill process.

FIG. 4 is a flow diagram depicting various operations in a method for optimizing a DID feature fill process. The method depicted in FIG. 4 is an example of a method according to FIG. 1. First, at 402, imaging of features prior to fill is performed. According to various embodiments, calibration of a behavior model is done based on a limited number of samples. For example, there may be no more than 10 samples, and in some embodiments, between 3 and 7 samples. This permits the process to be performed while limiting the number of costly and time consuming depositions on wafers. The imaged features may be on "demo wafers"—any non-production wafer or other substrate having features suitable for testing with, e.g., metrology. A coupon, which may be a small portion of a standard size wafer, is an example of a demo wafer. In addition to coupons and other non-standard format substrates with features, demo wafers may be standard size wafers such as 200 mm wafers, 300 mm wafers, and 450 mm wafers.

Analysis of the pre-fill feature images is then performed at 404. The result can include feature profile, sidewall angle, feature depth, critical dimensions, etc. At 406, post Dep1 imaging of the features is performed. Referring back to stage 210 of FIG. 2, at this stage, the feature is partially filled with a layer of the fill material. The subsequent image analysis in 410 may output the thickness profile of the layer as well as or instead of the metrology results described above. At 412, Dep2 progression imaging is performed. The images generated at 412 are then analyzed at 414. The information can include the thickness of the deposited film, and in some embodiments, the presence and location of any void formation. Further, the inhibition itself may be unable to be detected on an image-i.e., after stage 220, the treated surfaces 206 may not be detected on an image. Accordingly, information about the inhibition also is extracted from observations of the deposition.

The image analysis results from operations 404, 410, and 414 are used for behavior model calibration at 416, which is discussed further below with respect to FIG. 5. Virtual DOE can then be performed and optimized process prediction can then be performed at 420 and 422. In the example of FIG. 4, the optimized process may result in void-free fill. The optimized process may then be validated by an actual feature fill at 422. If the feature fill passes, the process ends. If not, the process may return to operation 418 for further exploration of parameter space or to operation 416 for further calibration of the model.

Figure 5:
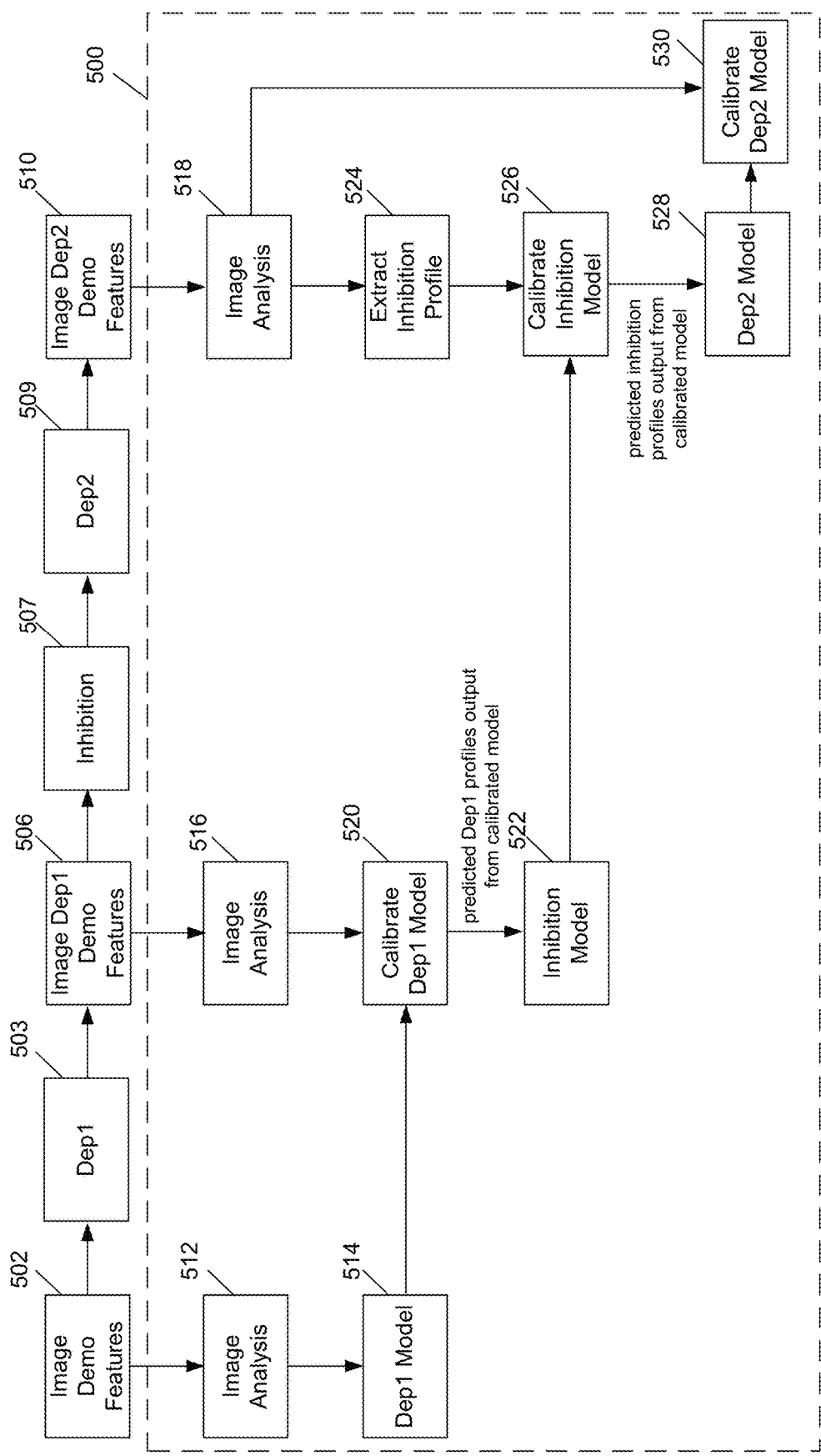
FIG. 5 is a diagram depicting operations (including deposition and inhibition operations on demo wafers and related metrology) and logic modules (implemented in software) for calibrating behavioral models in a DID process.

FIG. 5 is a diagram depicting operations (including deposition and inhibition operations on demo wafers and related metrology) and logic modules (implemented in software) for calibrating behavioral models in a DID process. At 502, the unfilled features on demo wafers are imaged as described above with respect to FIG. 4. A film is then deposited in the features under conditions expected to be used in the production process to partially fill the features in a Dep1 process, as described above with respect to FIG. 2. See 503. The features are then imaged at 506. The features are then subject to an inhibition process under conditions used in a production process, also as described above with respect to FIG. 2. See 507. This is followed by another deposition process (Dep2) under conditions expected to be used in the production process. See 509. The features are then imaged at 510. As described above, the Dep2 process may be stopped prior to full feature fill for imaging.

As illustrated in FIG. 5, image analysis is performed on the imaged features. See operations 512, 516, and 518. Image analysis may be performed using software 500. Also within software 500 is a dep1 model that for a given set of deposition conditions, predicts a dep1 profile. In certain embodiments, the dep1 model 514 is a behavioral model as the SEMulator3D™ available from Coventor, Inc. a Lam Research Company, of Fremont, Calif. As described further below, in some implementations, behavioral models employ abstractions of processes to predict structural details of features produced by one or more semiconductor device fabrication operations. Examples of behavioral models are presented in U.S. Pat. Nos. 9,015,016 and 9,659,126, both incorporated by reference herein.

Data generated in image analysis 516 may be used to iteratively calibrate the Dep1 model. This is reflected in a calibration module 520 and its interaction with the Dep1 model 514. Calibration module 520 receives data representing image analysis results from 516 and dep1 profiles predicted by dep1 model 514. Discrepancies between the profiles predicted by dep1 model 514 and the image analysis results are used to adjust floated parameters in the dep1 model or otherwise modify the model to improve its predictive ability. This can be an iterative approach in which the modified dep1 model predicts the dep1 profiles using input of image analysis from 512. The predicted profiles are then compared with corresponding image analysis results. This procedure continues iteratively until model parameters or other adjustable features converge.

The profiles predicted by the calibrated Dep1 model are then input to the inhibition model 522. The inhibition model is behavioral model that predicts an inhibition profile and may be any appropriate commercially available or user generated custom behavioral model. In some embodiments, it may be a SEMulator3D™ model available from Coventor, Inc., a Lam Research company, of Fremont, Calif. Since the inhibition profile generally cannot be imaged, the inhibition profile is calibrated using inhibition profiles that are extracted from the post-dep2 image analysis at 518.

An extraction module 524 receives data representing image analysis results from 518 and extracts the inhibition profile of each feature. The analytical framework of the inhibition profile can be based on a physical understanding of the process. For example, in some embodiments, may be based on surface saturation and molecular diffusion. In some embodiments, the inhibition profile may generally be inversely correlated with the dep2 profile, with thinner dep2 thicknesses correlated with more inhibition. Discrepancies between the profiles predicted by inhibition model 522 and the extracted profiles are used to adjust non-fixed parameters in the inhibition model 522 or otherwise modify the model to improve its predictive ability. Predicted inhibition profiles from the calibration module 526 are input into a dep2 model 528, which also may be a behavioral model. In some embodiments, the dep2 model may be calibrated using a calibration module 530 that compares the predicted dep2 profiles with data from image analysis at 518.

In some embodiments, a Dep1 model may not be used or calibrated. Instead, the structures input into the inhibition model 522 may be directly from the image analysis 516. Operation 502 and modules 512, 514, and 520 may be omitted in some such embodiments.

Figure 6:
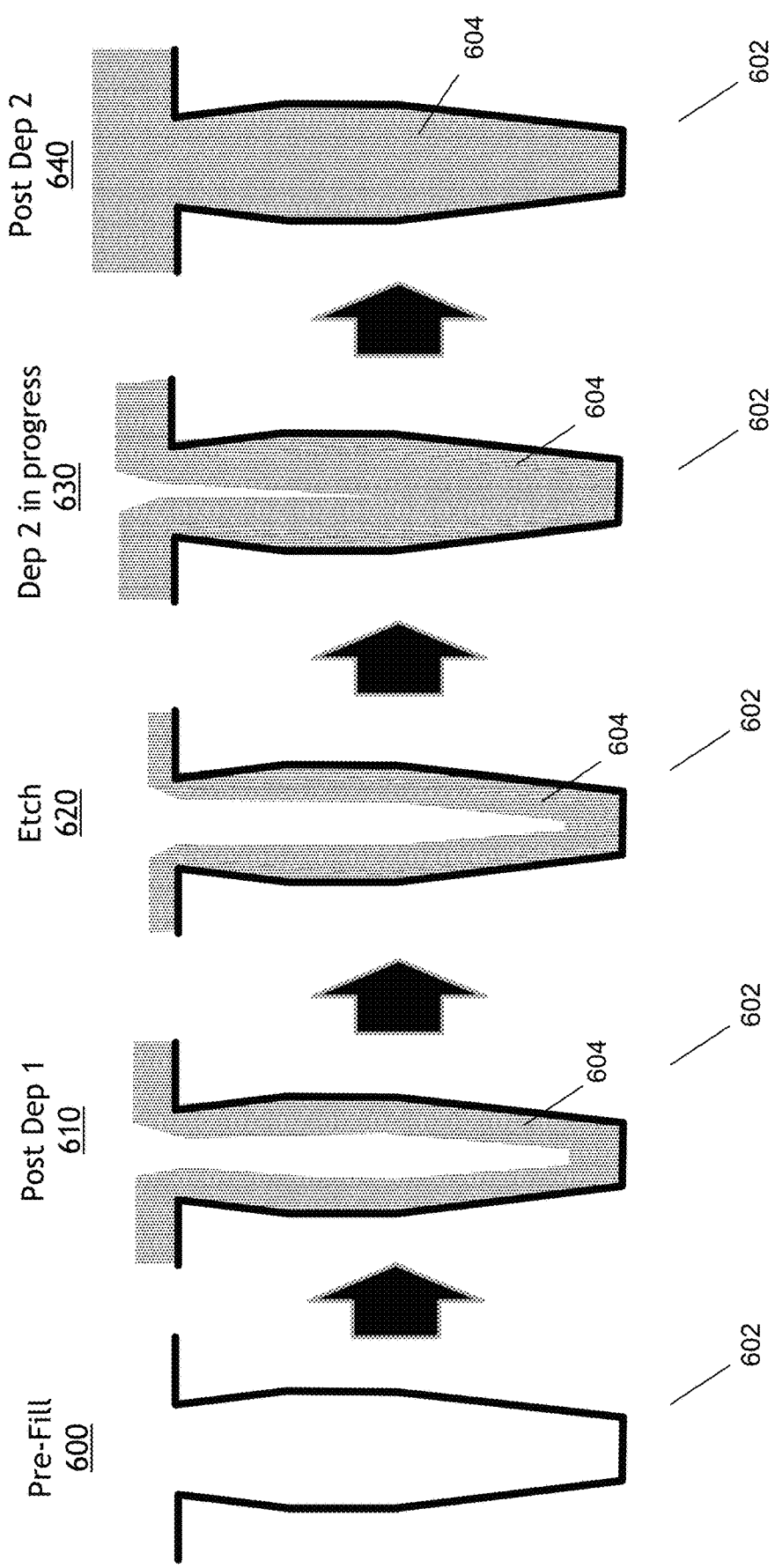
FIG. 6 illustrates a deposition-etch-deposition (DED) process for feature fill.

The method described in FIG. 1 may also be implemented with other feature fill processes, such as deposition-etch-deposition or DED. FIG. 6 shows an example of a DED deposition process that may be optimized using behavior models as described herein. First, at 600, an unfilled feature 602 is shown at a pre-fill stage, and at 610, the feature 602 is shown after an initial deposition of the fill material to form a layer of the material 604 to be filled in the feature 602. As with the initial deposition described for the DID method in FIG. 2, in FIG. 6, examples of material include tungsten, cobalt, and molybdenum, though the techniques described herein may be used to optimize fill of any appropriate material. At 620, the feature 602 is shown after an etch operation. The etch may be non-conformal such that it preferentially etches near the top of the feature. The etch may involve various mechanisms depending on various factors including the surfaces to be etched, the etch chemistry, and the etch species (e.g., ionic or radical species). In one example, tungsten is etched using atomic fluorine generated in a remote plasma generator. The etch may be chemical or physical etch. As with other operations described herein, the methods do not rely on a detailed or complete understanding of the physical mechanisms that cause the etching behavior.

In the example of FIG. 6, more material is etched near the feature opening during stage 620. This opens the feature to allow deposition species to reach further into the feature during the Dep2 stage at 630 and can prevent the formation of voids and seams within the filled feature. In the example of FIG. 6, as the Dep2 proceeds at 630 to 640, the feature is completely filled with the material 604.

Figure 7:
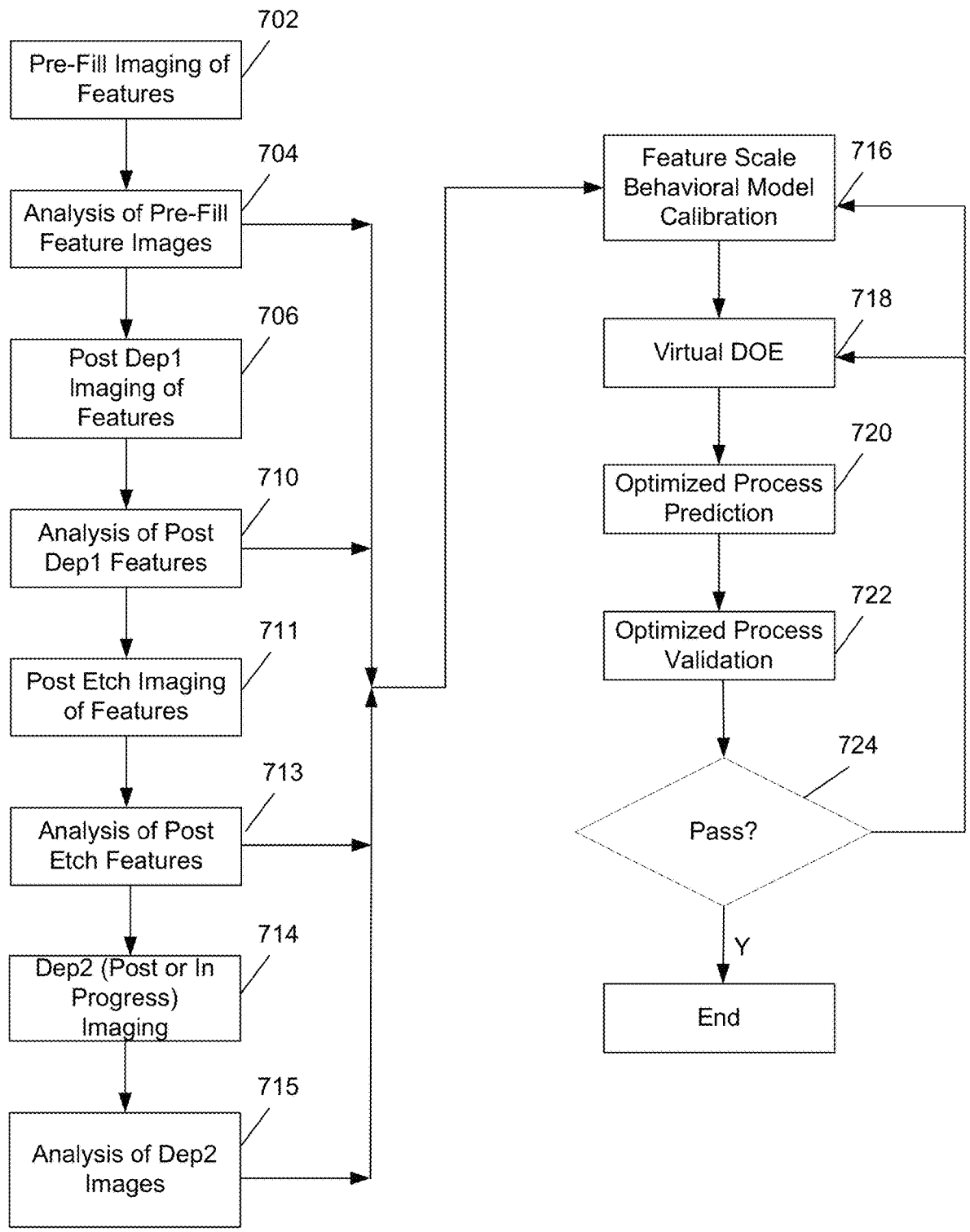
FIG. 7 is a flow diagram depicting various operations for optimizing a DED feature fill process.

FIG. 7 is a flow diagram depicting various operations in a method for optimizing a DED feature fill process. The method depicted in FIG. 7 is another example of a method according to FIG. 1. First, at 702, imaging of features prior to fill is performed. As described above with respect to the flow diagram for DID in FIG. 4, there may be no more than 10 samples, and in some embodiments, between 3 and 7 samples. Analysis of the pre-fill feature images is then performed at 704. Also as described with respect to FIG. 4, the result can include feature profile, sidewall angle, feature depth, critical dimensions, etc. At 706, post Dep1 imaging of the features is performed. Referring to stage 610 of FIG. 6, at this stage, the feature is partially filled with a layer of the fill material. The subsequent image analysis in 710 may output the thickness profile of the layer as well as or instead of the metrology described above.

At 711, post etch imaging of features is performed. Referring to stage 620 of FIG. 6, at this stage, the feature is partially filled with a layer of the fill material, though the profile of the fill is different from stage 610. Accordingly, the subsequent image analysis in 713 may output the thickness profile of the layer as well as or instead of the metrology described above. At 714, Dep2 imaging is performed. According to various embodiments, this may be done before or after the dep2 operation is completed. The information can include the thickness of the deposited film, and in some embodiments, the presence and location of any void formation.

The image analysis results from operations 704, 711, and 715 are used for behavior model calibration at 716, which is discussed further below with respect to FIG. 8. Virtual DOE can then be performed and optimized process prediction can then be performed at 720 and 722. In the example of FIG. 7, the optimized process may result in void-free fill. The optimized process may then be validated by an actual feature fill at 722. If the feature fill passes, the process ends. If not, the process may return to operation 718 for further exploration of parameter space or 716 with the data used to further refine the calibration.

Figure 8:
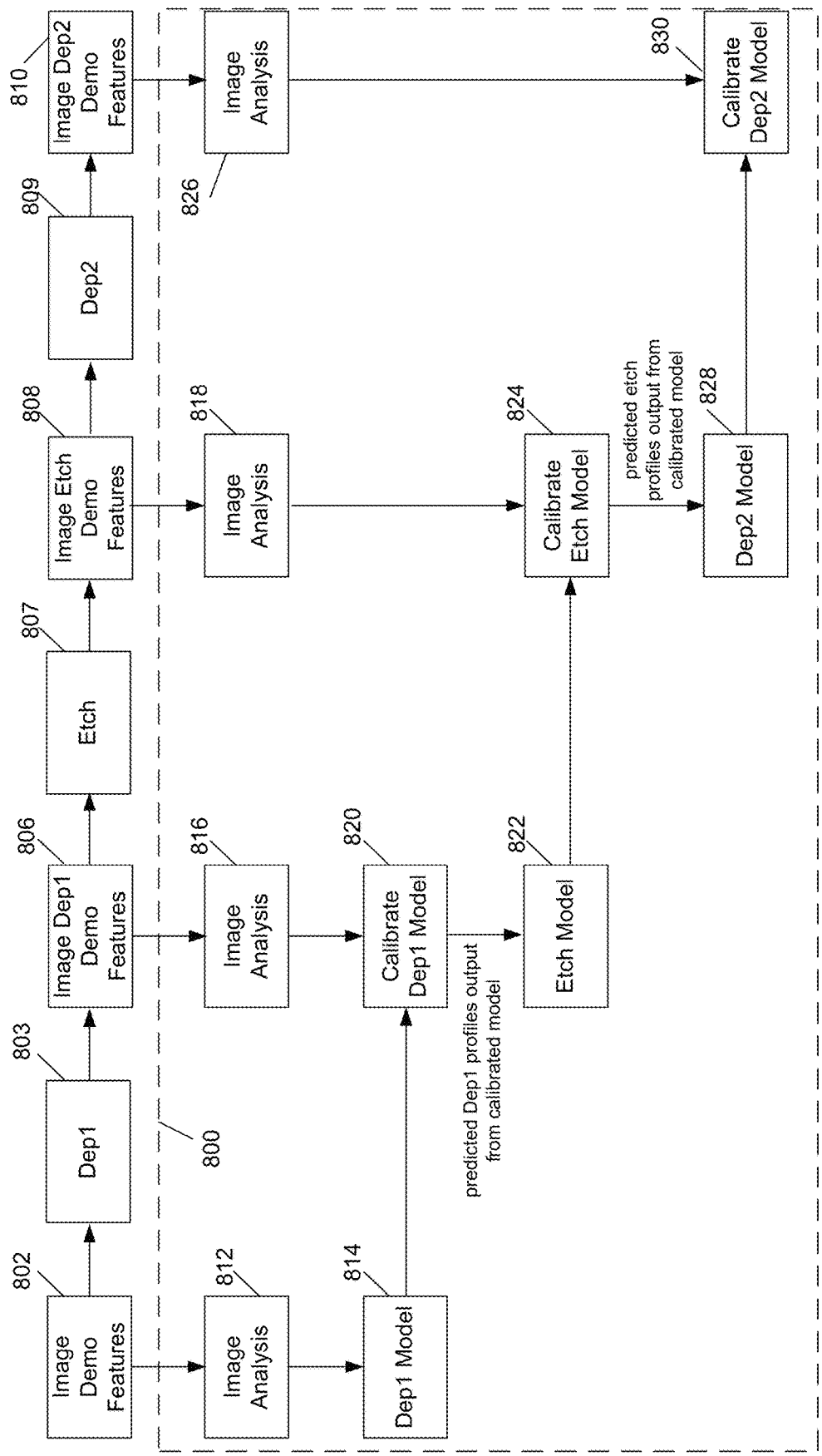
FIG. 8 is a diagram depicting operations and logic modules for calibrating behavioral models in a DED process.

FIG. 8 is a diagram depicting operations (including deposition and etch operations on demo wafers and related metrology) and logic modules (implemented in software) for calibrating behavioral models in a DED process. The operation flow depicted in FIG. 8 is similar to that of FIG. 5, with the exception that the features may generally be imaged after etching to determine the image profile. This unlike the inhibition profiles, which are extracted from post-inhibition deposition images.

At 802, the unfilled features on demo wafers are imaged as described above. A film is then deposited in the features under conditions expected to be used in the production process to partially fill the features in a Dep1 process, as described above with respect to FIG. 6. See 703. The features are then imaged at 806. The features are then etched under conditions used in a production process, also as described above with respect to FIG. 6. See 807. The features are then imaged at 808. This is followed by another deposition process (Dep2) under conditions expected to be used in the production process. See 809. The features are then imaged at 810. As described above, the Dep2 process may be or may not be stopped prior to full feature fill for imaging.

As illustrated in FIG. 8, image analysis is performed on the imaged features. See operations 812, 816, 818, and 826. Image analysis may be performed using software 800. Also within software 800 is a dep1 model that for a given set of deposition conditions predicts a dep1 profile. In certain embodiments, the dep1 model 814 is a behavioral model as the SEMulator3D™ available from Coventor, Inc. of Cary, N.C.

Data generated in image analysis 816 may be used to iteratively calibrate the Dep1 model. This is reflected in a calibration module 820 and its interaction with the Dep1 model 814. Calibration module 820 may calibrate the Dep1 model as described above with respect to calibration module 520 in FIG. 5.

The profiles predicted by the calibrated Dep1 model are then input to the etch model 822. Like the deposition and inhibition models, the etch model can be a behavioral model that predicts an etch profile (or a post-etch profile) and may be a SEMulator3D™ model available from Coventor, Inc. of Cary, N.C. Discrepancies between the profiles predicted by etch model 822 and the image analysis results from 818 are used to adjust floated parameters in the inhibition model 822 or otherwise modify the model to improve its predictive ability. Predicted etch profiles from the calibration module 824 are input into a dep2 model 828, which also may be a behavioral model. In some embodiments, the dep2 model may be calibrated using a calibration module 830 that compares the predicted dep2 profiles with data from image analysis at 826.

In some embodiments, a Dep1 model may not be used or calibrated. Instead, the structures input into the etch model 822 may be directly from the image analysis 816. Operation 802 and modules 812, 814, and 820 may be omitted in some such embodiments.

In addition to the DID and DED fill processes described above, feature fill processes that may be optimized according to the method of FIG. 1 include processes that have multiple inhibition and/or etch operations, for example $D(ID)_n$ and $D(ED)_n$ where n is an integer greater than 1, e.g., DIDID or DEDED. In some embodiments, the fill operation may include both inhibition and deposition, e.g., DIDED or DEID. Still further, any of the deposition, inhibition, or etch operations may be performed consecutively, e.g., deposition-inhibition-inhibition-deposition (DIID).

As discussed above, a behavioral model generally includes parameters, the value of which changes during the calibration process. The model may include fixed parameters and floated process parameters. A fixed parameter is a parameter whose value is fixed during an optimization process (e.g., calibration) used to improve the performance of the process simulation model. In other words, a value of fixed model parameter does not change during the optimization process. This is distinct from a floated parameter, whose value changes during the optimization exercise. In some embodiments, a fixed parameter is directly controllable and/or easy to measure. Examples include a substrate temperature, one or more applied radio frequency or plasma conditions in the reaction chamber, one or more process gas conditions in in the reaction chamber, a pressure in in the reaction chamber, or any combination thereof. However, a fixed parameter may alternatively be local or mechanistic parameter.

A floated parameter is a parameter whose value floats (e.g., changes) during an optimization process. An iterative modification of the floated parameter value from an initial or seed value to a final value is a goal of the calibration process. Thus a behavioral model configured with a final value of the parameter provides better predictive capability than a model configured with the initial value of the parameter.

In certain embodiments, a floated parameter represents a characteristic of a feature undergoing the semiconductor device fabrication operation (e.g., deposition, etch, or inhibition). General examples include difficult to measure local conditions in a reactor and/or mechanistic properties of reactions during the semiconductor device fabrication operation. In some examples, the characteristic is a reaction rate constant, a sticking coefficient, a diffusion constant, a saturation constant, or any combination thereof. However, the parameters are not limited to such parameters. Examples of such non-mechanistic parameters include a temperature in the reaction chamber, a pressure in in the reaction chamber, applied plasma conditions, or any combination thereof. In some embodiments, a parameter includes more globally focused parameters for a given process, which is represented by the model. Examples of such parameters include lateral deposition rate, vertical deposition rate, and inhibitor removal rate, all for a given material subject to the operation.

In various embodiments, a parameter combines any two or more of parameters characterizing the substrate undergoing the semiconductor device fabrication operation. The combination may be a product or sum of the individual values of the parameters, either of which may be weighted based on the relative importance of the individual parameters to the predictive ability of the model or based on other factors. Sometimes, some or all values of the individual parameters are normalized prior to the combination. In some embodiments, the individual values are provided as separate contributions in the form of a vector. In some cases, the parameter does not have a known connection to particular physical and/or chemical processes of the device fabrication operation. Such parameters may be appropriate when optimizing behavioral models as described herein.

During an iterative calibration process, the value of a floated parameter, at any iteration, is deemed the "current value" of the floated parameter. The value of the parameter during a prior iteration might be called a prior value of the floated parameter, and the value of the parameter during a successive iteration might be called a successive value of the floated parameter. A modification of the value of a floated process model parameter from one iteration to the next is sometimes called an update of the current value of the floated parameter. At the end of the iterative optimization process, the value of the floated parameter is called the final value of the floated parameter.

To calibrate a model, such as a deposition, inhibition, or etch model as described herein, is to improve the ability of the model to predict the result of a result of a semiconductor device fabrication operation that the model is designed to simulate. Often in the discussion herein, a calibration routine optimizes a model by iteratively adjusting the current value of one or more floated parameters. During optimization, a computationally predicted result of a model, which uses current value(s) of the floated parameter(s), may be compared with an experimentally determined result (e.g., an image analysis or other metrology result), with both the predicted result and the experimentally determined result being generated for the same semiconductor device fabrication operation. The comparison provides a cost value that reflects the magnitude of the difference (or agreement) between the predicted/simulation result and the experimentally determined result. The optimization routine uses the cost value to at least (i) determine whether the value(s) of the floated parameter value(s) have converged, and (ii) if the value(s) have not converged, determining how to adjust the current value(s) of the floated parameter(s) for the next iteration. In certain embodiments, the process uses not only the cost value of the current iteration, but the prior cost values of all or some of the historical iterations, to search for a global optimum.

To "compare" values of a computationally predicted result of a model and an experimentally determined result (e.g., an image analysis or other metrology result), as used herein, means to compare one or more features or indices of the two results. The comparison provides a cost value or values for the optimization process. Examples of differences (cost values) include L1 and L2 norms, a Euclidean distance, and Mahalanobis distance in multidimensional result space. As an example using results having multiple features or indices, the comparison may be done by extracting multiple indices to describe differences. As examples, these indices may be the critical dimension (CD) differences at multiple depths of a feature, thickness differences for a given material, void percentage or void area of a feature, location of void (absolute location and/or relative to another part of the feature such as the neck or field area), length or height of a feature, and contact resistance of a feature. These indices make up the cost function for optimization; the function may also be a combination of them, with weight factors for each. The cost function is sometimes referred to herein as a "difference," which should be interpreted more broadly than the simple mathematical operation A minus B.

The floated parameter values "converge," as used herein, when a process simulation model configured with them performs adequately for the application at hand. Various convergence criteria are known in the art and may be applied. Some of them are described below. Generally, cost values are evaluated in each iteration of an optimization routine. A cost value produced during a single iteration may be evaluated in isolation or in conjunction with cost values from other iterations. Such evaluation allows the optimization routine to conduct a convergence check. If the cost value or cost values indicate the current value of the floated parameter provides a process simulation model that performs acceptably and/or is no longer improving significantly, the optimization routine terminates the process and deems the current value of the floated process model parameter to be the final value. The optimization routine has converged. Thus, in certain embodiments, the convergence method determines when the error of parameter estimation (cost function) can no longer be improved. This allows a Bayesian view to the termination problem. The convergence check may search for local or global minimum in the cost value (or maximum depending on the structure of the cost value).

As described above, the deposition, inhibition, and etch models used in the methods of FIGS. 1, 4, 5, 7, and 8 may be behavioral models that employ abstractions of processes to predict structural details of features produced by actual deposition, inhibition, and etch operations. Each model may be expressed as a linear or non-linear function of one or more parameters. The behavioral parameters may be "numerical" parameters that may related to physical parameters but describe behavior of the inhibition or other process. For example, an "effective sticking coefficient" may describe the propensity of an inhibition species to inhibit nucleation at a particular position in a feature. Such a parameter may depend on mass transport related physical parameters (e.g., diffusion coefficient, partial pressure) and reaction related physical parameters (e.g., surface reaction rate). It is not necessary to fully understand the process or the actual parameters that determine the behavior.

In some embodiments, for example, a model for nitrogen ion based inhibition may be expressed as a non-linear function $P_{z,t}=f(K,A,B,t,z)$ where $P_{z,t}$ is the inhibition thickness at a time t and vertical depth z, K is a saturation constant, and A and B are behavioral parameters. Such a model may be used in inhibition processes that are known to be subject to saturation; for example, plasma inhibition is saturated but CVD deposition of an inhibition typically is not.

Figure 9:
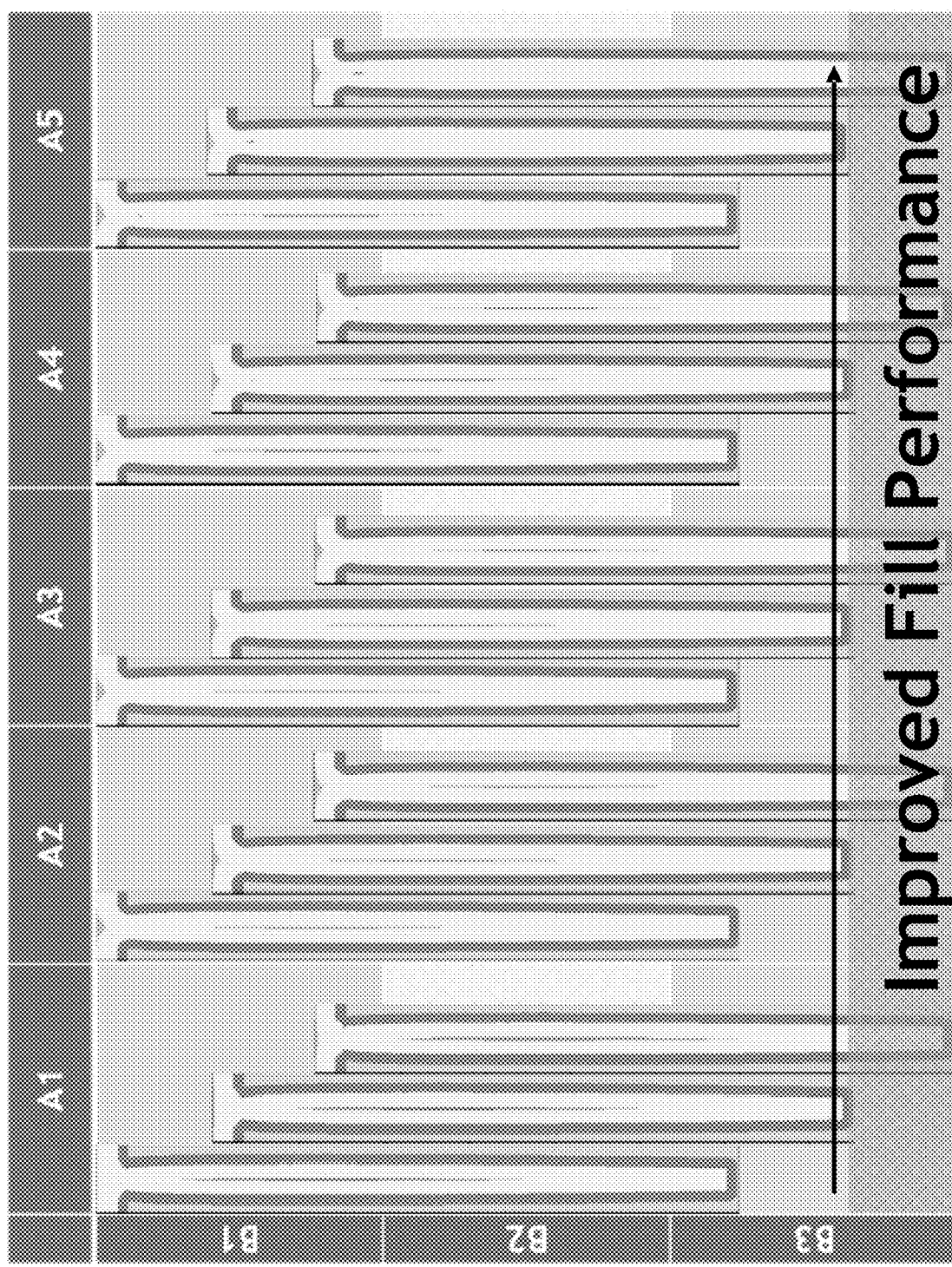
FIG. 9 is an example showing feature fill results from simulations using a calibrated behavior model with behavioral parameters varied.

While the actual inhibition process may depend on hundreds or more physical parameters, a behavioral model as implemented herein may use a significantly reduced set of parameters. In the example above, $P_{z,t}=f(K,A,B,t,z)$, two behavioral parameters (A and B) are used, with K, t, and z being known and fixed. FIG. 9 is an example showing feature fill results from simulations using a calibrated behavior model $P_{z,t}=f(K,A,B,t,z)$ described above, with A and B varied. Varying the parameters gives a range of different profiles, with fill performance improved from A1/B1 to A5/B3 for example.

A and B are not purely numerical parameters but proportional or otherwise correlated to physical parameters. For example, in a process that is known to be diffusion-limited, A can be an effective (or numerical) diffusion coefficient and B a parameter related to the stability of the nitrogen ions. By using a small set of parameters known to be related to the physics of the operation, the process outlined in FIG. 1 is efficient and the behavioral parameters can be correlated to actual process parameters to design an actual process for use in semiconductor fabrication. Each of the parameters A and B can be calibrated to the tool recipe settings. As such a process engineer may use a virtual DOE to find an optimized process from which a process recipe may be derived. Still further, in some embodiments, the model may include only parameters (e.g., pressure, temperature, reactant concentration, time, etc.) that are part of a process recipe.

According to various embodiments, a behavioral model may employ fewer than ten, or fewer than five behavioral parameters, and in some embodiments, only one, two, or three such parameters.

In some embodiments, a dep1 model for conformal deposition may be expressed as a linear function. A dep2 model may further include a parameter related to how fast the inhibitor is removed, as lateral growth at certain level may only occur after the inhibitor is removed.

The deposition models may also account for pattern dependency. That, the process operations may depend on the pattern density, feature size, and/or aspect ratio. U.S. Pat. No. 9,659,126, incorporated by reference above, describes modeling pattern dependent effects.

In some embodiments, an aspect ratio dependent etch (ARDE) model as described in U.S. Pat. No. 9,659,126, incorporated by reference above, may be used to model an etch process as described above.

Certain embodiments disclosed herein relate to systems for generating and/or using process simulation models. Certain embodiments disclosed herein relate to methods for generating and/or using a process simulation model implemented on such systems. A system for generating a process simulation model may be configured to analyze data for calibrating or optimizing the expressions or relationships used to represent the effects of a semiconductor device fabrication operation on a substrate. A system for generating a process simulation model may also be configured to receive data and instructions such as program code representing physical processes occurring during the semiconductor device fabrication operation. In this manner, a process simulation model is generated or programmed on such system. A programmed system for using a process simulation model may be configured to (i) receive input such as process parameters characterizing the semiconductor device fabrication operation, and (ii) execute instructions that determine the effect of the semiconductor device fabrication operation on a feature on the substrate. To this end, the system may calculate time-dependent and/or depth-dependent result of a semiconductor device fabrication operation.

Many types of computing systems having any of various computer architectures may be employed as the disclosed systems for implementing process simulation models and algorithms for generating and/or optimizing such models. For example, the systems may include software components executing on one or more general purpose processors or specially designed processors such as programmable logic devices (e.g., Field Programmable Gate Arrays (FPGAs)). Further, the systems may be implemented on a single device or distributed across multiple devices. The functions of the computational elements may be merged into one another or further split into multiple sub-modules.

In some embodiments, code executed during generation or execution of a process simulation model on an appropriately programmed system can be embodied in the form of software elements which can be stored in a nonvolatile storage medium (such as optical disk, flash storage device, mobile hard disk, etc.), including a number of instructions for making a computer device (such as personal computers, servers, network equipment, etc.).

At one level a software element is implemented as a set of commands prepared by the programmer/developer. However, the module software that can be executed by the computer hardware is executable code committed to memory using "machine codes" selected from the specific machine language instruction set, or "native instructions," designed into the hardware processor. The machine language instruction set, or native instruction set, is known to, and essentially built into, the hardware processor(s). This is the "language" by which the system and application software communicates with the hardware processors. Each native instruction is a discrete code that is recognized by the processing architecture and that can specify particular registers for arithmetic, addressing, or control functions; particular memory locations or offsets; and particular addressing modes used to interpret operands. More complex operations are built up by combining these simple native instructions, which are executed sequentially, or as otherwise directed by control flow instructions.

The inter-relationship between the executable software instructions and the hardware processor is structural. In other words, the instructions per se are a series of symbols or numeric values. They do not intrinsically convey any information. It is the processor, which by design was preconfigured to interpret the symbols/numeric values, which imparts meaning to the instructions.

The models used herein may be configured to execute on a single machine at a single location, on multiple machines at a single location, or on multiple machines at multiple locations. When multiple machines are employed, the individual machines may be tailored for their particular tasks. For example, operations requiring large blocks of code and/or significant processing capacity may be implemented on large and/or stationary machines.

In addition, certain embodiments relate to tangible and/or non-transitory computer readable media or computer program products that include program instructions and/or data (including data structures) for performing various computer-implemented operations. Examples of computer-readable media include, but are not limited to, semiconductor memory devices, phase-change devices, magnetic media such as disk drives, magnetic tape, optical media such as CDs, magneto-optical media, and hardware devices that are specially configured to store and perform program instructions, such as read-only memory devices (ROM) and random access memory (RAM). The computer readable media may be directly controlled by an end user or the media may be indirectly controlled by the end user. Examples of directly controlled media include the media located at a user facility and/or media that are not shared with other entities. Examples of indirectly controlled media include media that is indirectly accessible to the user via an external network and/or via a service providing shared resources such as the "cloud." Examples of program instructions include both machine code, such as produced by a compiler, and files containing higher level code that may be executed by the computer using an interpreter.

In various embodiments, the data or information employed in the disclosed methods and apparatus is provided in an electronic format. Such data or information may include design layouts, fixed parameter values, floated parameter values, feature profiles, metrology results, and the like. As used herein, data or other information provided in electronic format is available for storage on a machine and transmission between machines. Conventionally, data in electronic format is provided digitally and may be stored as bits and/or bytes in various data structures, lists, databases, etc. The data may be embodied electronically, optically, etc.

In certain embodiments, a process simulation model can each be viewed as a form of application software that interfaces with a user and with system software. System software typically interfaces with computer hardware and associated memory. In certain embodiments, the system software includes operating system software and/or firmware, as well as any middleware and drivers installed in the system. The system software provides basic non-task-specific functions of the computer. In contrast, the modules and other application software are used to accomplish specific tasks. Each native instruction for a module is stored in a memory device and is represented by a numeric value.

Figure 10:
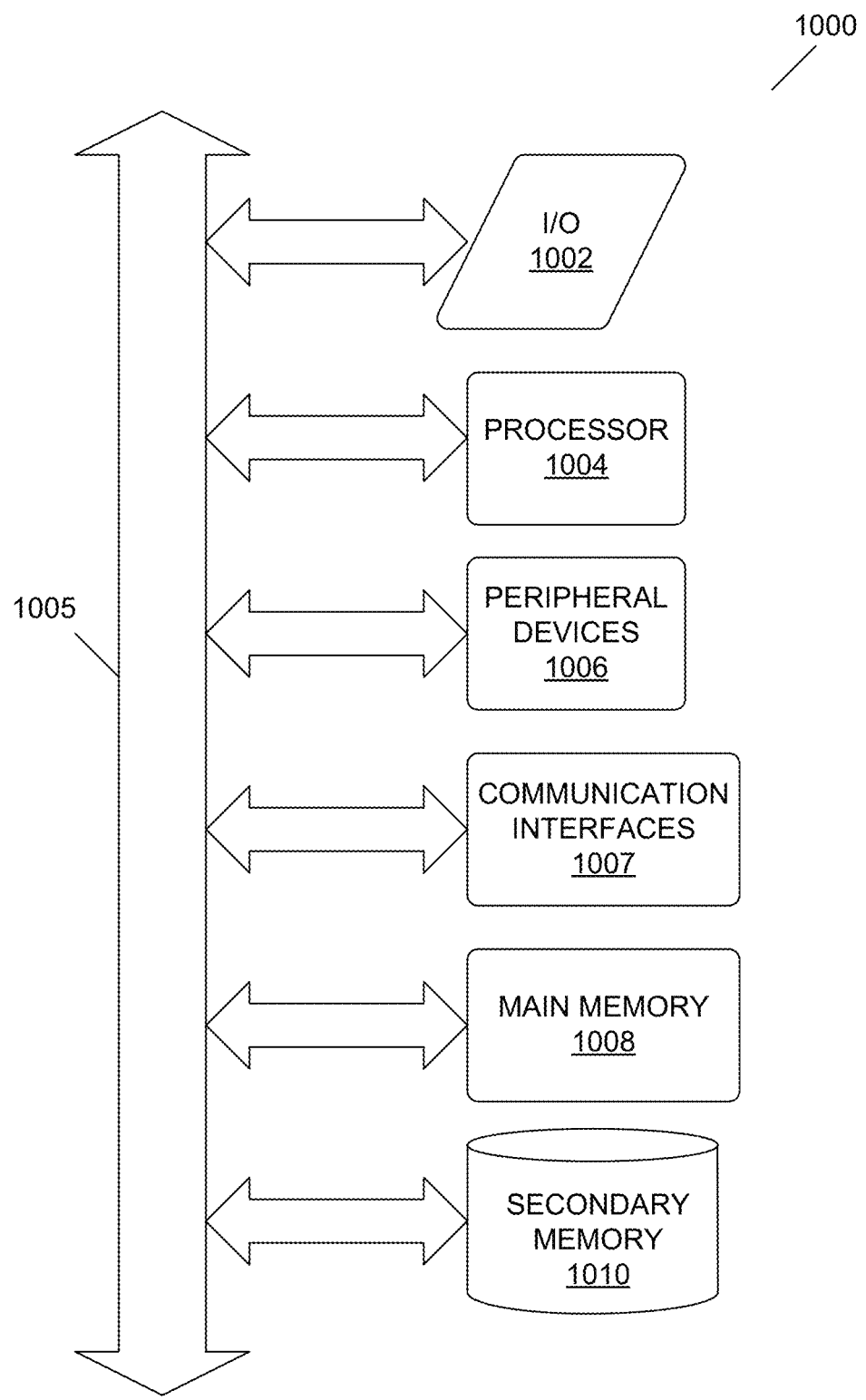
FIG. 10 shows an example computational system that may be used to implement the processes described herein.

An example computer system 1000 is depicted in FIG. 10. As shown, computer system 1000 includes an input/output subsystem 1002, which may implement an interface for interacting with human users and/or other computer systems depending upon the application. Embodiments of the invention may be implemented in program code on system 1000 with I/O subsystem 1002 used to receive input program statements and/or data from a human user (e.g., via a GUI or keyboard) and to display them back to the user. The I/O subsystem 1002 may include, e.g., a keyboard, mouse, graphical user interface, touchscreen, or other interfaces for input, and, e.g., an LED or other flat screen display, or other interfaces for output.

Program code may be stored in non-transitory media such as persistent storage or secondary memory 1010 or memory 1008 or both. One or more processors 1004 reads program code from one or more non-transitory media and executes the code to enable the computer system to accomplish the methods performed by the embodiments herein, such as those involved with generating or using a process simulation model as described herein. Those skilled in the art will understand that the processor may accept source code, such as statements for executing training and/or modeling operations, and interpret or compile the source code into machine code that is understandable at the hardware gate level of the processor. A bus 1005 couples the I/O subsystem 1002, the processor 1004, peripheral devices 1006, memory 1008, and secondary memory 1010.

What is claimed is:

1. A feature fill optimization computational system comprising:
    one or more processors;
    program instructions for executing on the one or more processors, the program instructions comprising instructions for:
    obtaining metrology results from feature fill operations performed on a set of sample features, the feature fill operations comprising a deposition operation and one or both of an inhibition operation and an etch operation;
    using the metrology results to calibrate a behavioral model of the feature fill operations; and
    iteratively applying the calibrated behavioral model while varying one or more behavioral parameters to optimize the behavioral parameters.

2. The feature fill optimization computational system of claim 1, wherein the instructions further comprise instructions for, from the optimized behavioral parameters, designing a feature fill process to be performed on a semiconductor substrate.

3. The feature fill optimization computational system of claim 1, wherein the feature fill operations include an inhibition operation and the behavioral model includes an inhibition model.

4. The feature fill optimization computational system of claim 3, wherein the feature fill operations include a first deposition operation prior to the inhibition operation and a second deposition operation after the inhibition operation.

5. The feature fill optimization computational system of claim 4, wherein the behavioral model includes one or more deposition models.

6. The feature fill optimization computational system of claim 3, wherein the feature fill operations include an etch operation and the behavioral model includes an etch model.

7. The feature fill optimization computational system of claim 1, wherein the feature fill operations include multiple inhibition operations and the behavioral model includes one or more inhibition models.

8. The feature fill optimization computational system of claim 1, wherein the feature fill operations include an etch operation and the behavioral model includes an etch model.

9. The feature fill optimization computational system of claim 8, wherein the feature fill operations include a first deposition operation prior to the etch operation and a second deposition operation after the etch operation.

10. The feature fill optimization computational system of claim 1, wherein the feature fill operations include multiple etch operations and the behavioral model includes one or more etch models.

11. The feature fill optimization computational system of claim 9, wherein the behavioral model includes one or more deposition models.

12. The feature fill optimization computational system of claim 1, wherein the metrology results comprise image analysis results.

13. The feature fill optimization computational system of claim 1, wherein the set of sample features has no more than ten sample features.

14. The feature fill optimization computational system of claim 1, wherein the instructions further comprise instructions to optimize the behavioral parameters based on one or more of electrical resistance, void area, and void location.

15. The feature fill optimization computational system of claim 1, wherein instructions for calibrating the behavior model comprise instructions for adjusting the behavior model using discrepancies between feature fill profiles generated from the behavior model and the metrology results.

16. A computer-implemented method comprising:
    obtaining metrology results from feature fill operations performed on a set of sample features, the feature fill operations comprising a deposition operation and one or both of an inhibition operation and an etch operation;
    using the metrology results to calibrate a behavioral model of the feature fill operations wherein the metrology results comprise image analysis results and calibrating the behavior model comprises adjusting the behavior model using discrepancies between feature fill profiles generated from the behavior model and the image analysis results; and
    iteratively applying the calibrated behavioral model while varying one or more behavioral parameters to optimize the behavioral parameters.

17. The method of claim 16, further comprising, from the optimized behavioral parameters, designing a feature fill process to be performed on a semiconductor substrate.

18. The method of claim 17, further comprising performing the feature fill process.

19. A computer program product for optimizing a feature fill process, the computer program product comprising a non-transitory computer readable medium on which is provided computer executable instructions for:
    obtaining metrology results from feature fill operations performed on a set of sample features, the feature fill operations comprising a deposition operation and an inhibition operation;
    using the metrology results to calibrate a behavioral model of the feature fill operations the behavior model comprising a deposition model and an inhibition model; and
    iteratively applying the calibrated behavioral model while varying one or more behavioral parameters to optimize the behavioral parameters.

20. The feature fill optimization computational system of claim 19, wherein the feature fill operations include a first deposition operation prior to an inhibition operation and a second deposition operation after the inhibition operation.

* * * * *